(12) United States Patent
Ogino et al.

(10) Patent No.: US 8,809,778 B2
(45) Date of Patent: Aug. 19, 2014

(54) PATTERN INSPECTION APPARATUS AND METHOD

(75) Inventors: Ryuichi Ogino, Tokyo (JP); Soichi Shida, Tokyo (JP); Yoshiaki Ogiso, Tokyo (JP)

(73) Assignee: Advantest Corp., Tokyo (JP)

( * ) Notice: Subject to any disclaimer, the term of this patent is extended or adjusted under 35 U.S.C. 154(b) by 58 days.

(21) Appl. No.: 13/616,596

(22) Filed: Sep. 14, 2012

(65) Prior Publication Data

US 2013/0234020 A1 Sep. 12, 2013

Related U.S. Application Data

(60) Provisional application No. 61/609,625, filed on Mar. 12, 2012.

(51) Int. Cl.
*H01J 37/28* (2006.01)

(52) U.S. Cl.
USPC .............................. 250/306; 250/307; 250/310

(58) Field of Classification Search
CPC ........ G01B 15/00; G06K 9/6201; H01J 37/28
USPC .......................................................... 250/306
See application file for complete search history.

(56) References Cited

U.S. PATENT DOCUMENTS

| | | | | |
|---|---|---|---|---|
| 7,075,075 B2 * | 7/2006 | Adamec et al. | ............... | 250/310 |
| 8,478,022 B2 * | 7/2013 | Nikaido | ........................ | 382/145 |
| 2008/0250380 A1 * | 10/2008 | Kijima et al. | ................... | 716/18 |
| 2013/0146763 A1 * | 6/2013 | Kawada et al. | ............... | 250/306 |

FOREIGN PATENT DOCUMENTS

| | | |
|---|---|---|
| JP | 2005-265424 | 9/2005 |
| JP | 2008-218259 | 9/2008 |
| JP | 2011-169835 | 9/2011 |

OTHER PUBLICATIONS

Office action issued by German Patent Office for counterpart German application and its English translation.
Bunday et al. "Automated CD-SEM Recipe Creation—A new Paradigm in CD-SEM Utilization" Proc. of SPIE, 2006.
Morokuma et al. "A new matching engine between design layout and SEM image of semiconductor device" Proc. of SPIE, 2005.
Tabery "Use of Design Pattern Layout for Automated Metrology Recipe Generation" Proc. of SPIE, 2005.
Inoue et al. "CD-SEM image-distortion measured by View-Shift Method" Proc. of SPIE, 2011.
Office action issued by Japanese Patent Office for the counterpart Japanese application and its English translation.

* cited by examiner

*Primary Examiner* — Phillip A Johnston
(74) *Attorney, Agent, or Firm* — Muramatsu & Associates

(57) ABSTRACT

A pattern inspection apparatus configured to perform pattern inspection based on a SEM image previously measures distortion amount data representing a magnitude distribution of positional displacement caused by distortion of the SEM image in a scanning direction. When the pattern inspection is performed, the apparatus makes design data and the SEM image correspond to each other by adjusting at least one of the design data and the SEM image on the basis of the distortion amount data, and places a measurement region on the SEM image on the basis of a correspondence between the design data and the SEM image. The apparatus may further find a matching rate between a pattern of the design data and a pattern of the SEM image.

11 Claims, 15 Drawing Sheets

$\Delta S = S_{design} - S_{sem}$ $\Delta S = [(S_{design} \cup S_{sem}) - S_{design}] + [S_{design} - (S_{design} \cap S_{sem})]$ $\Delta S = S_{sem} - S_{design}$

PATTERN INSPECTION APPARATUS AND METHOD

CROSS-REFERENCE TO RELATED APPLICATION

This application is entitled to the benefit of Provisional Patent Application No. 61/609,625, filed on 12 Mar. 2012.

FIELD

The embodiments discussed herein are related to a pattern inspection apparatus and a pattern inspection method which evaluate the dimensions and shapes of patterns on the basis of a SEM image.

BACKGROUND

Several methods have been proposed for pattern inspection using a SEM image. For example, there is a method of designating a portion to be inspected on the SEM image using design data. There is another method of detecting a defect by comparing patterns of the design data with those on the SEM image.

However, if there is distortion in the SEM image, correspondence between the SEM image and the design data cannot be ensured even by using the above methods and thus accurate inspection cannot be performed.

For example, Japanese Laid-open Patent Publication No. 2011-169835 discloses such conventional technologies noted above.

SUMMARY

An objective of the present invention is to provide a pattern inspection apparatus and a pattern inspection method which enable accurate inspection even if there is distortion in a SEM image.

According to an aspect of the present invention, there is provided a pattern inspection apparatus which includes: an electron scanning unit configured to scan a surface of a sample with an electron beam and to detect secondary electrons emitted from the surface of the sample; a signal processor configured to create a SEM image on the basis of a relation between irradiation position with the amount of the secondary electrons; a storage configured to store distortion amount data representing a magnitude of positional displacement in a scanning direction of the electron beam where the positional displacement is caused by distortion of the SEM image; and a controller configured to match design data with the SEM image by adjusting at least one of the design data and the SEM image on the basis of the distortion amount data.

In the above aspect, the controller may include: a measurement region setting unit configured to set a measurement region on a pattern of the design data for the sample with reference to the design data; a measurement region adjusting unit configured to adjust positional coordinates of the measurement region on the basis of the distortion amount data and to place the adjusted measurement region on the SEM image; and a measurement unit configured to measure dimensions of a pattern inside the measurement region on the SEM image.

In the above aspect, the control unit may include a contour point coordinate correcting unit configured to correct coordinates of contour points of a pattern of the SEM image on the basis of the distortion amount data; an alignment unit configured to align a pattern of the design data with the pattern of the SEM image with reference to the design data for the sample and on the basis of the contour points of the pattern of the SEM image and vertices of the pattern of the design data; and a comparison inspection unit configured to measure a matching rate between the pattern of the design data and the pattern of the SEM image.

According to another aspect of the present invention, there is provided a pattern inspection method which includes the steps of: creating a SEM image of a sample by scanning a surface of the sample with an electron beam and detecting secondary electrons emitted from the surface of the sample; matching design data with the SEM image on the basis of distortion amount data representing a magnitude of positional displacement in a scanning direction of the electron beam where the positional displacement is caused by distortion of the SEM image; and evaluating a pattern of the SEM image on the basis of a correspondence between the design data and the SEM image.

According to the above aspects, any of the design data and the SEM image is adjusted on the basis of the distortion amount data representing the magnitude of the positional displacement in the scanning direction of the electron beam, the positional displacement being caused by the distortion of the SEM image. Thereby, even if the SEM image is distorted, the design data and the SEM image can correspond to each other and thus accurate pattern inspection using the design data can be performed.

DESCRIPTION OF EMBODIMENTS

The background technology is described with reference to FIGS. 1A-1B and 2-4 before a description of an embodiment of the present invention.

In a pattern inspection method using a SEM image, a rectangular measurement region is placed on the SEM image to cross edges of a pattern to be measured. Next, a plurality of line profiles are extracted from the inside of the measurement region where each line profile represents a brightness distribution along a line segment extending in a given direction. Then, the position of a portion of each extracted line profile whose brightness differs significantly from the rest is detected. Thereafter, edge positions of the pattern are found by averaging the positions of the portions representing the significant changes in brightness among the line profiles. Further, a width of each pattern and a distance between the patterns are measured on the basis of the edge positions detected by the above method.

As described above, the measurement region is set for the measurement target pattern in the dimensional measurement using the SEM image.

However, it is difficult to manually place measurement regions for performing the dimensional measurement if there are a large number of measurement target patterns of the SEM image. To solve this, the inventers of the present application have considered a method of automatically setting measurement regions by using design data as described below.

Figure 1A:
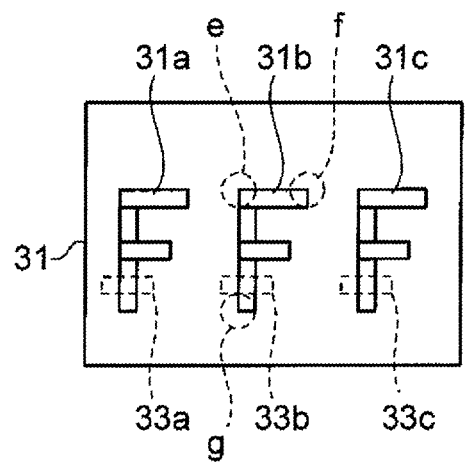
FIGS. 1A and 1B are views showing a method of placing measurement regions as a background technology of the present invention.
Figure 1B:
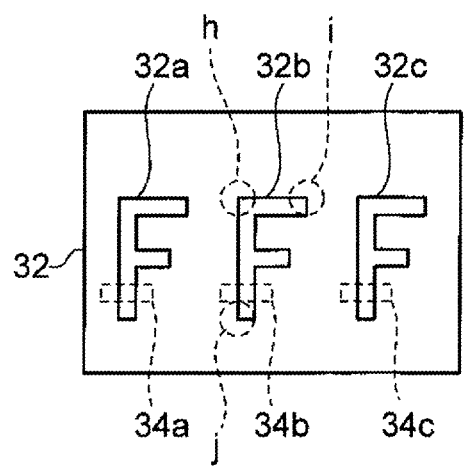

FIG. 1A is a view showing a method of setting measurement regions on the basis of design data. FIG. 1B is a view for describing a method of placing the measurement regions set in FIG. 1A on the SEM image.

Design data 31 shown in FIG. 1A is CAD (Computer Aided Design) data in a GDS (Graphic Database System) format, for example. Patterns of the design data 31 are each represented as a set of rectangular small regions (also called blocks). In the example of FIG. 1A, patterns 31a, 31b, and 31c are each represented as four rectangular small regions.

A description is given here of an example in which the line width of each of the patterns 31a, 31b, and 31c is measured. First, measurement regions are set for the respective patterns 31a, 31b, and 31c of the design data 31 in such a way that each measurement region crosses a rectangular small region contained in the corresponding pattern.

For example, as shown in FIG. 1A, measurement regions 33a, 33b, and 33c are set for the respective patterns 31a, 31b, and 31c at the small regions each located in the same position of the corresponding pattern. Although the measurement region may be placed at every small region, the measurement region is set for one small region per pattern here for simplifying the description.

Next, measurement regions are placed on the SEM image 32 of FIG. 1B by using the positional coordinates of the measurement regions 33a, 33b, and 33c on the design data 31.

Here, the SEM image 32 and the design data 31 are aligned with each other by observing an unillustrated alignment pattern, but are displaced from each other in a translational direction because of insufficient alignment accuracy. For this reason, if the positional coordinates of the measurement regions 33a, 33b, and 33c set on the design data 31 are used without any adjustment, misalignment between the patterns and the measurement regions may occur and (one or both of) edges of each pattern may not successfully be detected in the corresponding measurement region.

To cope with this, positional adjustment of the measurement regions is carried out as described below by using a vertex sequence which comprises data on coordinates of vertices of small regions contained in a pattern of the design data 31, and a contour point sequence which comprises data on coordinates of contour points of the corresponding pattern of the SEM image 32.

First, one to several patterns representative of the design data 31 are selected, and vertex sequences are found by collecting vertices of small regions contained in the selected patterns. Next, contour point sequences of the corresponding patterns of the SEM image 32 are extracted.

Here, a vertex sequence is extracted from the pattern 31b located in the center of the design data 31, and a contour point sequence is extracted from the central pattern 32b of the SEM image 32.

Then, misalignment between the design data and the SEM image is found on the basis of a relation between the positional coordinates of each of the vertices of the vertex sequence and the positional coordinates of the corresponding contour point of the contour point sequence, and the coordinates of the measurement regions of the design data are adjusted according to the found misalignment. For example, the coordinates of the central positions of the respective measurement regions 33a, 33b, and 33c are adjusted in such a manner, that the coordinates of each of the vertices of the pattern 31b of the design data 31 match the coordinates of the corresponding contour point of the pattern 32b of the SEM image 32.

Thereby, the positional coordinates of the measurement regions to be placed on the SEM image 32 are found, and the placement of measurement regions 34a, 34b, and 34c on the SEM image 32 is completed.

Incidentally, the positioning of the measurement regions described above may involve not only the adjustment of positional displacement in the translational direction but also the adjustment of magnification deviation or positional displacement in a rotational direction.

It is found, however, that the positional displacement of the measurement regions in part of the SEM image may be not fully adjusted even by the positioning of the measurement regions using the above method, and dimension measurement may sometimes end in failure.

Figure 2:
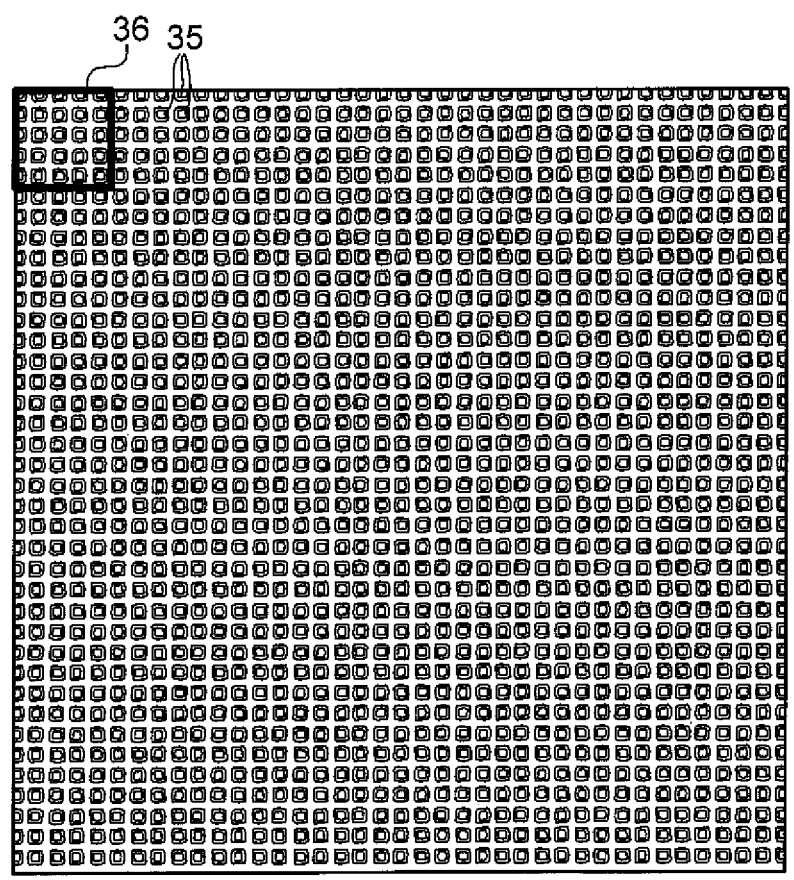
FIG. 2 is a view showing an example of a SEM image according to another background technology of the present invention.
Figure 3:
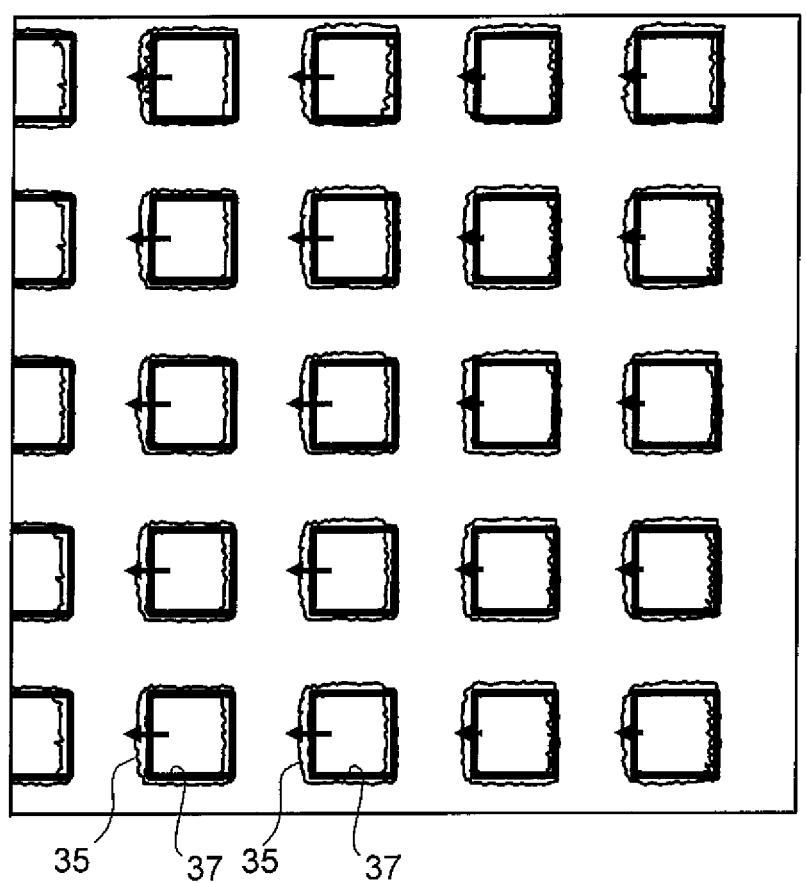
FIG. 3 is a view showing measurement regions placed in a frame portion of FIG. 2.

FIG. 2 shows an example of the SEM image according to the background technology of the present invention, and FIG. 3 shows a result of placing the measurement regions in a frame portion 36 (at and near the periphery) of the SEM image shown in FIG. 2.

Here, measurement regions are placed on respective rectangular patterns 35 which appear in the SEM image shown in FIG. 2, with the method described with reference to FIGS. 1A and 1B.

As a result, as shown in FIG. 3, the center of the rectangular pattern 35 is displaced from the center of a measurement region 37 in a direction indicated by the arrow. Accordingly, what can be acquired in the measurement region 37 is only the right edge of the rectangular pattern 35. Consequently, the width of the rectangular pattern 35 cannot be measured by setting the measurement region 37 as shown in FIG. 3.

According to various investigations, it was found that the SEM image causes the positional displacement of the measurement regions.

Figure 4:
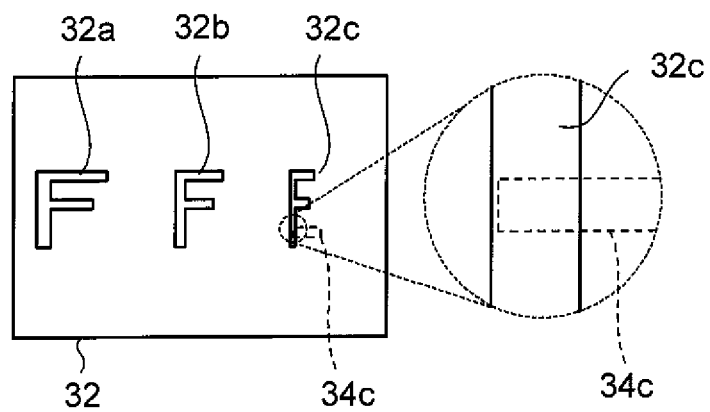
FIG. 4 is a view showing a problem caused when distortion occurs in the SEM image.

FIG. 4 is a view showing a problem which arises when distortion occurs in the SEM image 32.

As schematically shown in FIG. 4, distortion of the SEM image 32 occurs in a scanning direction of an electron beam (lateral direction in FIG. 4). Due to this distortion, as shown in a partially enlarged view, one of edges of a pattern 32c located on the right cannot be captured in a measurement region 34c placed on the pattern 32c.

For this reason, the measurement region 34c cannot be placed on the certain pattern 32c properly if the positioning is performed only by using the vertex sequence of the pattern of the design data and the contour point sequence of the pattern of the SEM image.

Such distortion of the SEM image occurs because an amount of deflection of the electron beam with respect to the magnitude of an excitation current on a deflection coil (magnetic deflector) used for scanning with the electron beam does not show a linear change. Thereby, as shown in FIG. 3, relatively large distortion occurs in the scanning direction (lateral direction in FIG. 3). It has also been found that a magnitude distribution of the positional displacement caused by the distortion of the SEM image is inherent to the deflection coil.

First Embodiment

Figure 5:
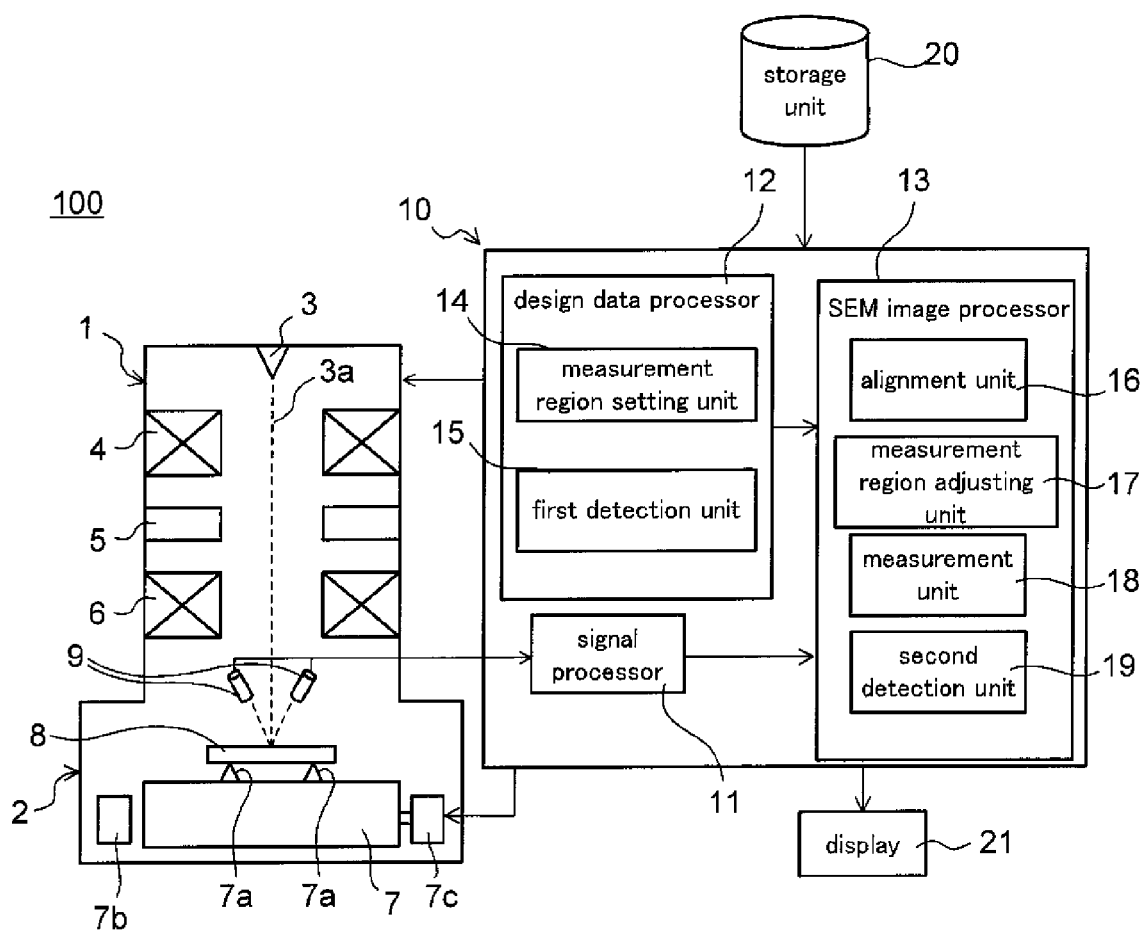
FIG. 5 is a block diagram of a pattern inspection apparatus according to a first embodiment of the present invention.

FIG. 5 is a block diagram of a pattern inspection apparatus 100 according to this embodiment.

As shown in FIG. 5, the pattern inspection apparatus 100 according to this embodiment includes: a chamber 2 configured to house a sample 8 therein; an electron scanning unit 1 configured to irradiate the sample 8 with an electron beam 3a; and a controller 10 configured to control the electron scanning unit 1 and the chamber 2 and to perform data processing.

The chamber 2 is provided with a stage 7 having supports 7a on its upper portion, and the sample 8 such as a wafer or a photomask is held on the supports 7a. The stage 7 is driven by a drive unit 7c. The position of the stage 7 is measured by a laser interferometer 7b.

A positioning mark (not shown) is formed on a surface of the sample 8. The positional coordinates of the sample 8 are determined by observing the positioning mark.

The electron beam 3a is emitted from an electron gun 3 of the electron scanning unit 1 placed above the sample 8. The electron beam 3a is converged by a condenser lens 4, is then deflected in a scanning manner with a deflection coil 5 (magnetic deflector), is then passed through an objective lens 6 and projected onto the surface of the sample 8.

Secondary electrons are emitted from the surface of the sample 8 by the irradiation with the electron beam 3a. The secondary electrons are detected and converted into an electrical signal by detectors 9.

The detection signal from the detectors 9 is inputted to a signal processor 11 of the controller 10. The signal processor 11 creates a SEM image of the surface of the sample on the basis of a relation between the intensity of the signal from the detectors 9 and the position of irradiation with the electron beam 3a. Then, the SEM image created by the signal processor 11 is sent to a SEM image processor 13 and, at the same time, is displayed on a display screen of a display 21.

A design data processor 12 of the controller 10 includes a measurement region setting unit 14 configured to set measurement regions with reference to the design data for the sample 8 stored in a storage 20. A first detection unit 15 of the design data processor 12 is configured to detect a vertex sequence, which is used for positioning the measurement regions, from a pattern of the design data.

The SEM image processor 13 includes a second detection unit 19 configured to detect a contour point sequence from the corresponding pattern of the SEM image. An alignment unit 16 of the SEM image processor 13 is configured to adjust the positional coordinates of the measurement regions of the design data on the basis of a positional relation between the vertex sequence of the pattern of the design data and the contour point sequence of the pattern of the SEM image.

Further, in this embodiment, a measurement region adjusting unit 17 of the SEM image processor 13 is configured to adjust the positional coordinates of the measurement regions on the design data on the basis of distortion amount data representing a magnitude distribution of positional displacement caused by the distortion of the SEM image in the scanning direction, and to place the adjusted measurement regions on the SEM image.

A measurement unit 18 of the SEM image processor 13 is configured to detect edge positions of the patterns in the measurement regions placed on the SEM image, and to carry out dimensional measurement.

The storage 20 stores therein the distortion amount data together with the design data for the sample, the distortion amount data representing the magnitude distribution of positional displacement in the scanning direction, which is caused by the distortion of the SEM image.

Hereinbelow, a description is given of a pattern inspection method using the pattern inspection apparatus 100.

First of all, distortion amount data on the SEM image is measured before the dimensional measurement using the SEM image.

Figure 6:
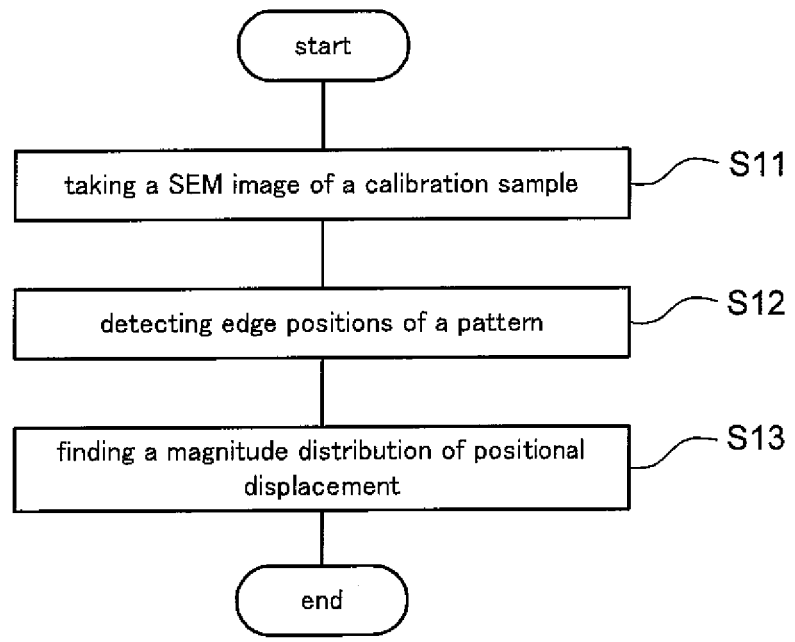
FIG. 6 is a flowchart showing a method of measuring a distortion amount data of the SEM image according to the first embodiment.
Figure 7A:
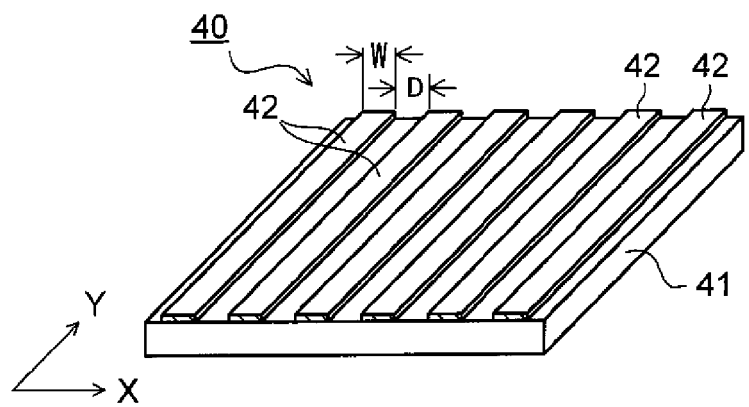
FIGS. 7A to 7C are views for describing the method of measuring the distortion amount data of the SEM image according to the first embodiment.
Figure 7B:
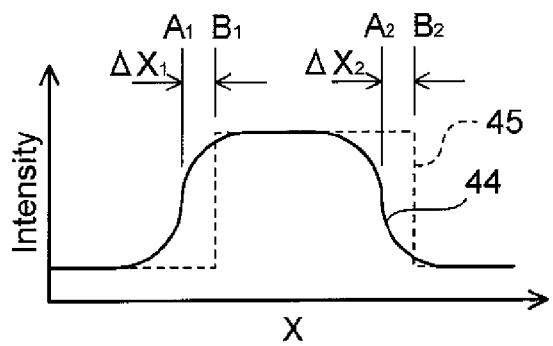
Figure 7C:
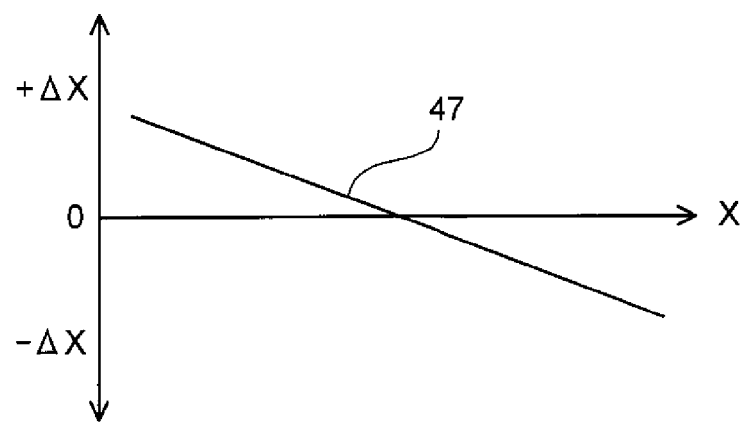

FIG. 6 is a flowchart showing a method of measuring distortion amount data on the SEM image, and FIGS. 7A to 7C are views for describing the method of measuring the distortion amount data.

First, as shown in Step S11 of FIG. 6, a SEM image of a calibration sample is taken by the pattern inspection apparatus 100.

A line space pattern 40 as shown in FIG. 7A may be used as the calibration sample, for example. In the line space pattern 40, a plurality of line patterns 42 made of a chromium film or the like are formed on a substrate 41 made of quartz glass, for example. These line patterns 42 are formed to have a uniform width W, and are spaced from each other at regular intervals D.

The line space pattern 40 is placed in such a way that the line patterns 42 are directed in a Y direction in the SEM image, and the SEM image is taken by moving the electron beam in an X direction for scanning.

Next, as shown in Step S12 of FIG. 6, edge positions of a pattern are detected from the SEM image acquired in Step S11.

Here, line profiles along a line segment crossing edges of the line patterns 42 are extracted.

FIG. 7B shows a portion of one of the line profiles extracted from the SEM image for the line space pattern shown in FIG. 7A.

Next, each line profile is differentiated to find a differential profile, and the position of a maximum value or a minimum value in the differential profile is detected as an edge position. Significant inclination portions of the line profile in FIG. 7B are detected as the edge positions. Alternatively, the edge positions may be found by using peak positions of the line profiles.

The detection of the edge positions of the line patterns is performed on all the line patterns included within the field of view of the SEM image.

Subsequently, in Step S13 of FIG. 6, a magnitude distribution of positional displacement in the scanning direction, which is caused by the distortion of the SEM image, is found.

The distortion amount of the SEM image can be obtained by finding how much the edge positions of the line patterns 42 of the line space pattern 40 detected in Step S12 are displaced from real edge positions thereof.

In the example of FIG. 7B, a dashed line 45 indicates the real position of the line pattern 42 and a solid line 44 indicates the line profile of the line pattern 42 found from the SEM image. In FIG. 7B, the left edge position of the line pattern 42 found from the SEM image is $A_1$ whereas the real left edge position of the line pattern 42 is $B_1$.

In this case, a distance $\Delta X_1$ between the real edge position $B_1$ and the edge position $A_1$ found from the SEM image is found as the magnitude of positional displacement of the position $A_1$ of the SEM image from the position $B_1$.

The above processes are carried out for all the edges of the line patterns 42. Thereby, the distortion amount data is found which represents a magnitude distribution of positional displacement at positions of the SEM image in the scanning direction (X direction).

It should be noted that the relation between the positions and the distortion amounts shown in FIG. 7C is merely an example and this relation is not necessarily linear.

The distortion amount data of the SEM image in the case where the electron beam is moved in the X direction for scanning is found with the above processes.

Then, another SEM image of the line space pattern is taken by moving the electron beam in the Y direction for scanning while placing the line space pattern in such a way that the line patterns 42 are directed in the X direction. Thereafter, the processes in Step S11 to Step S13 of FIG. 6 are performed. In this way, the distortion amount data of the SEM image in the case where the electron beam is moved in the Y direction for scanning is found.

It should be noted that the distortion amount data of the SEM image described above does not have to be measured every time pattern inspection is carried out, but may be measured upon shipment of the pattern inspection apparatus 100 or upon adjustment of the deflection coil 5 in maintenance work, for example.

The distortion amount data of the SEM image obtained by the above measurement is stored in the storage 20 of the pattern inspection apparatus 100, and is used for placement of the measurement regions and the dimensional measurement to be described below.

Figure 8:
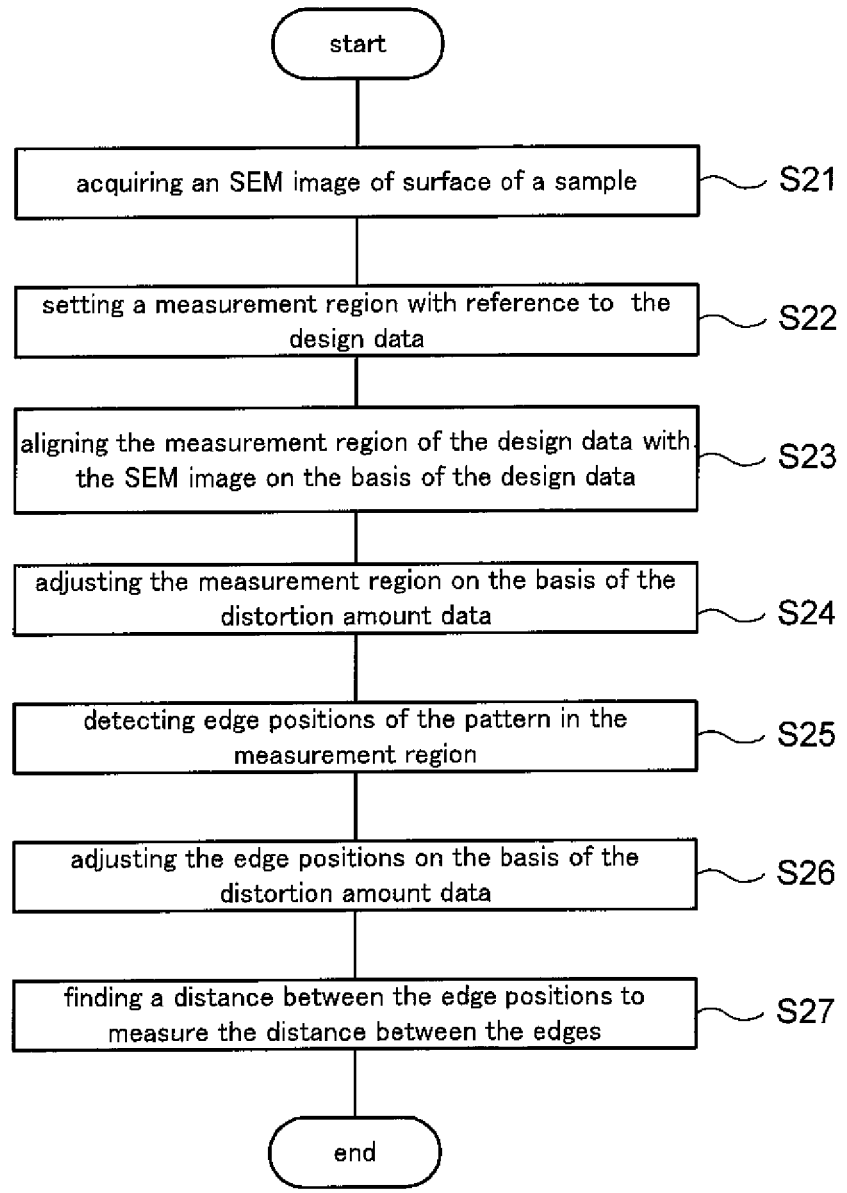
FIG. 8 is a flowchart showing a pattern inspection method according to the first embodiment.

FIG. 8 is a flowchart showing the pattern inspection method using the pattern inspection apparatus 100 of FIG. 5.

First, in Step S21 of FIG. 8, a SEM image of the surface of the sample 8 is acquired by the pattern inspection apparatus 100 (see FIGS. 1A and 1B).

Then, in Step S22, a measurement region setting unit 14 (see FIG. 5) of the design data processor 12 sets measurement regions with reference to design data.

Here, a measurement region is set on each pattern of the design data with the method described with reference to FIG. 1A.

Next, in Step S23 of FIG. 8, the alignment unit 16 of the SEM image processor 13 aligns the measurement region of the design data with the SEM image on the basis of a positional relation between a vertex sequence of a pattern of the design data and a contour point sequence of the corresponding pattern of the SEM image.

Here, the first detection unit 15 of the design data processor 12 of FIG. 5 detects the vertex sequence of the pattern of the design data and the second detection unit 19 of the SEM image processor 13 detects the contour point sequence of the pattern of the SEM image.

Subsequently, the alignment unit 16 aligns the position of the measurement region of the design data with the SEM image using the method described with reference to FIGS. 1A and 1B. Note that the size or angle of the measurement region of the design data may be adjusted if there is magnification deviation or positional displacement in the rotational direction between the SEM image and the design data.

Thereafter, in Step S24 of FIG. 8, the measurement region adjusting unit 17 of the SEM image processor 13 adjusts the coordinates of the central position of the measurement region with reference to and on the basis of the distortion amount data stored in the storage 20.

Figure 9:
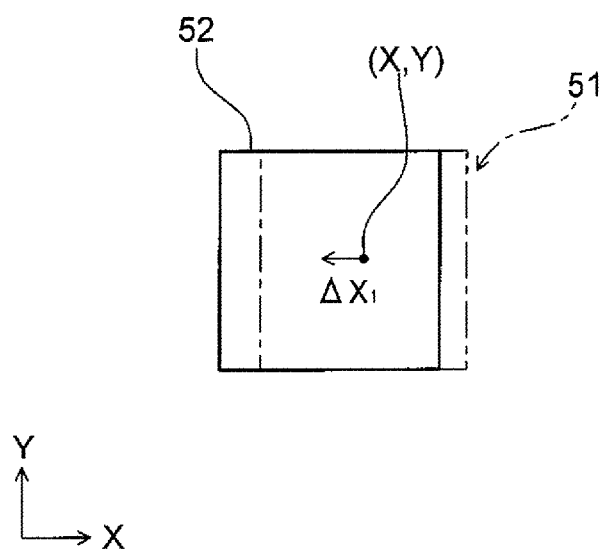
FIG. 9 is a plan view showing a method of adjusting the position of a measurement region on the basis of the distortion amount data of the SEM image in the pattern inspection method according to the first embodiment.

In the case where the SEM image is acquired by moving the electron beam in the X direction for scanning, for example, the magnitude of positional displacement at the coordinates of the center of the measurement region is found on the basis of the distortion amount data of FIG. 7C. Then, the found magnitude of positional displacement is added to the coordinates of the center of the measurement region 51 set in Step S23 as shown in FIG. 9, thereby finding the coordinates of the center of a measurement region 52 on the SEM image.

It should be noted that the coordinates of the central position of the measurement region in the Y direction should be adjusted if the electron beam is moved in the Y direction for scanning.

It should be further noted that distortion of the SEM image in a direction perpendicular to the scanning direction of the electron beam hardly occurs in the pattern inspection apparatus 100 because of the characteristics of the deflection coil 5; thus, adjustment in the direction perpendicular to the scanning direction of the electron beam does not have to be performed.

Thereafter, the adjusted measurement region 52 is placed on the SEM image and Step S24 of FIG. 8 is completed.

Next, in Step S25, the measurement unit 18 of the SEM image processor 13 detects edge positions of the pattern in the measurement region placed on the SEM image.

Here, the edge positions of the pattern are detected in the following way. Specifically, a plurality of line profiles are extracted from the measurement region. Then, these line profiles are each differentiated to detect the position of a maximum value (or a minimum value) of differential values. Thereafter, the positions of the maximum values (or the minimum values) of the differential values in the plurality of line profiles are averaged.

The edge positions detected in the above way are based on the positional coordinates of the distorted SEM image. Hence, the dimensions of the pattern cannot be accurately measured by using the detected edge positions without any adjustment.

To solve this, in next Step S26, the measurement unit 18 of the SEM image processor 13 adjusts the edge positions detected in Step S25, on the basis of the distortion amount data of the SEM image.

The measurement unit 18 adjusts the edge positions detected in Step S25 in the following way. Specifically, the measurement unit 18 finds the magnitude of positional displacement $\Delta X$ at the edge positions detected in Step S25 with reference to the distortion amount data of the SEM image. Then, the measurement unit 18 adds (or subtracts) the found magnitude of positional displacement $\Delta X$ to (or from) the positional coordinates of each edge detected in Step S25.

Subsequently, in Step S27, the measurement unit 18 of the SEM image processor 13 finds a distance between the edge positions thus adjusted in Step S26 to measure the distance between the edges.

With the above processes, the dimension measurement in the measurement region is completed.

As described above, according to the pattern inspection method of this embodiment, a position of a measurement region is adjusted on the basis of distortion amount data of a SEM image. Accordingly, even when the SEM image is distorted, the measurement region can be placed so as to be able to capture both edges of a pattern. Thus, the position of the measurement region does not need to be adjusted manually, and hence dimensional measurement in a large number of measurement positions can be performed promptly.

Further, according to this embodiment, edge positions detected from the SEM image are adjusted on the basis of the distortion amount data. Thus, accurate dimensional measurement can be performed even on the distorted SEM image.

Furthermore, since adjustment is made only on the measurement regions and the edge positions, the amount of calculations can be reduced considerably as compared to the case where the processing is performed in order to eliminate distortion from the entire SEM image.

Example

Hereinbelow, a description is given of an example where the inventors of the present application actually placed measurement regions on a SEM image on the basis of design data.

Figure 10:
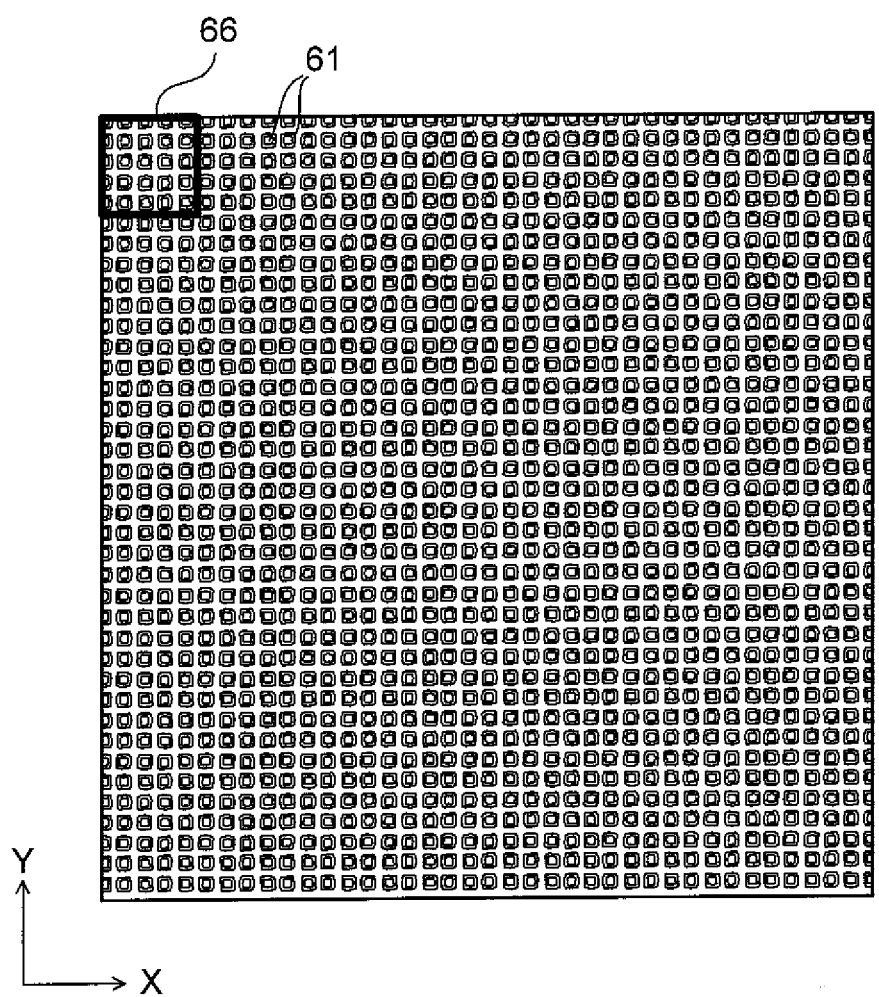
FIG. 10 is a view showing an example of the SEM image taken by the pattern inspection apparatus of FIG. 5.

FIG. 10 is a view tracing a SEM image of a sample used for the example.

As shown in FIG. 10, this example used a sample made by arranging rectangular patterns repeatedly in longitudinal and lateral directions at given pitches. On patterns of the SEM image obtained by observing the sample, measurement regions were respectively placed with the method described with reference to FIGS. 8 and 9.

Figure 11:
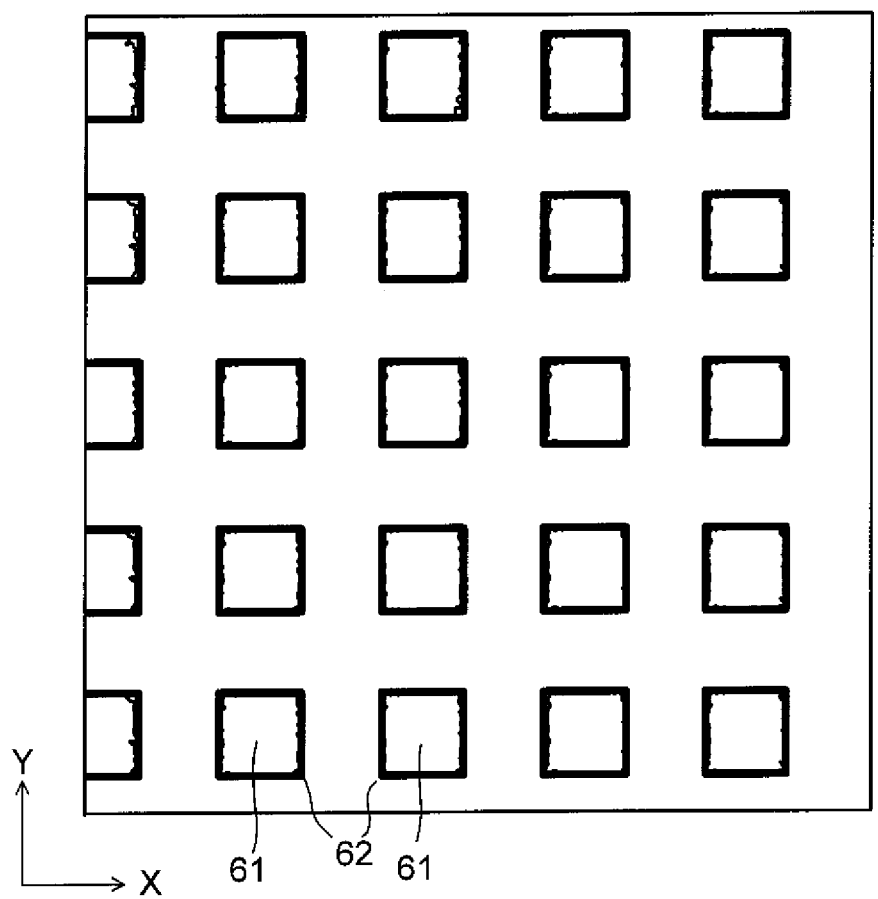
FIG. 11 is a view showing an example of placing measurement regions on the SEM image using the method described with reference to FIG. 8.

FIG. 11 is a view showing a result of placing the measurement regions on the SEM image in the example. Note that a portion shown in FIG. 11 corresponds to a portion shown in a rectangular frame 66 of FIG. 10.

As shown in FIG. 11, this example showed that two edges of a rectangular pattern 61 in a lateral direction were captured in a measurement region 62.

It was confirmed from the above result that the pattern inspection method according to this embodiment allows measurement regions to be placed accurately even when there is distortion in a SEM image.

Second Embodiment

In a second embodiment, a description is given of comparison inspection between patterns of a SEM image and patterns of design data.

Figure 12:
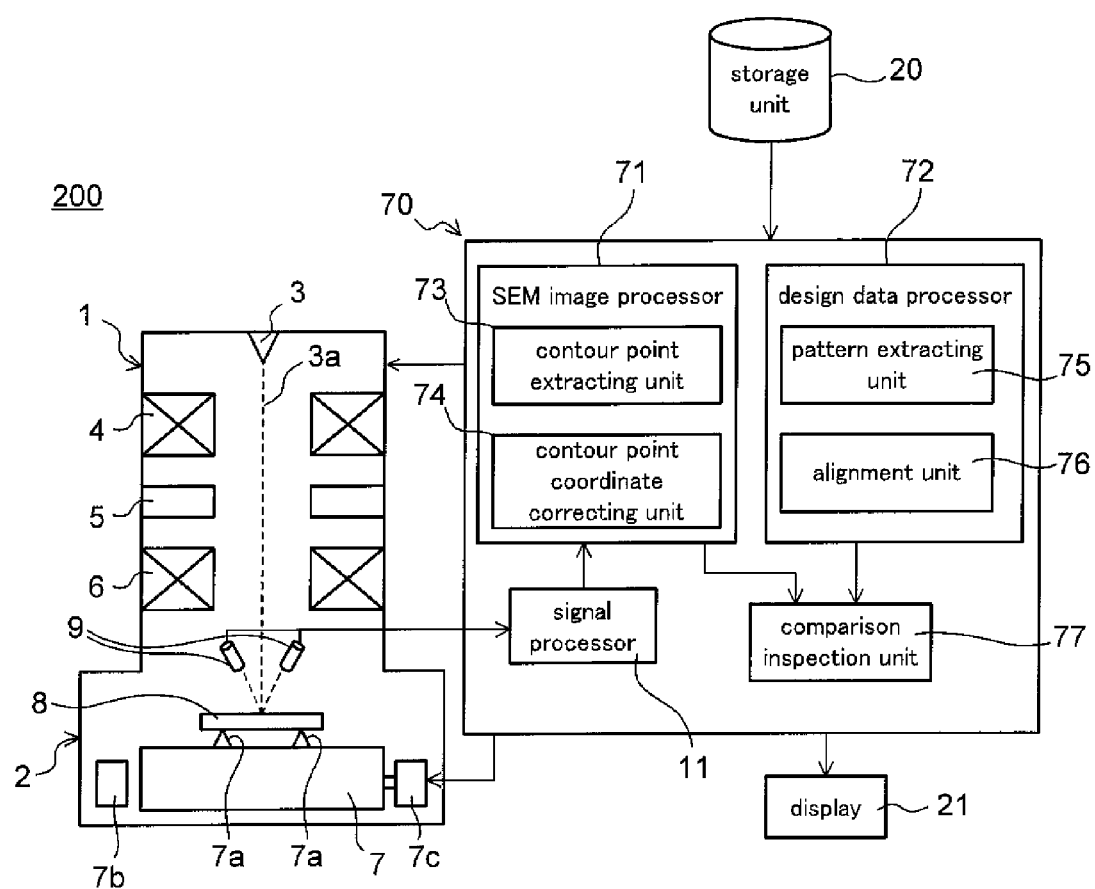
FIG. 12 is a block diagram showing a pattern inspection apparatus according to a second embodiment of the present invention.

FIG. 12 is a block diagram showing a pattern inspection apparatus 200 according to this embodiment. It should be noted that the configuration of the pattern inspection apparatus 200 is the same as that of the pattern inspection apparatus 100 of FIG. 5 except for a controller 70, and thus parts of the pattern inspection apparatus 200 having the same configuration as the pattern inspection apparatus 100 are denoted by the same reference numerals and a detailed description thereof is omitted.

As shown in FIG. 12, the controller 70 includes a SEM image processor 71, a design data processor 72, and a comparison inspection unit 77 in addition to a signal processor 11.

The SEM image processor 71 includes a contour point extracting unit 73 configured to extract a contour point sequence of each pattern of the SEM image. A contour point coordinate correcting unit 74 is configured to adjust the positional coordinates of the extracted contour points. The contour point coordinate correcting unit 74 corrects positional displacement of the positional coordinates of the contour points, which is caused by distortion of the SEM image in the scanning direction, with reference to distortion amount data stored in a storage 20.

The design data processor 72 includes a pattern extracting unit 75 and an alignment unit 76. The pattern extracting unit 75 is configured to cut out patterns from the design data, and to couple a plurality of small regions contained in each of the cut-out patterns together to convert them into one polygon. The alignment unit 76 is configured to position the extracted patterns at respective pattern positions on the SEM image.

The comparison inspection unit 77 is configured to compare the pattern of the design data with the pattern of the SEM image to calculate a difference and a matching rate therebetween.

Figure 13:
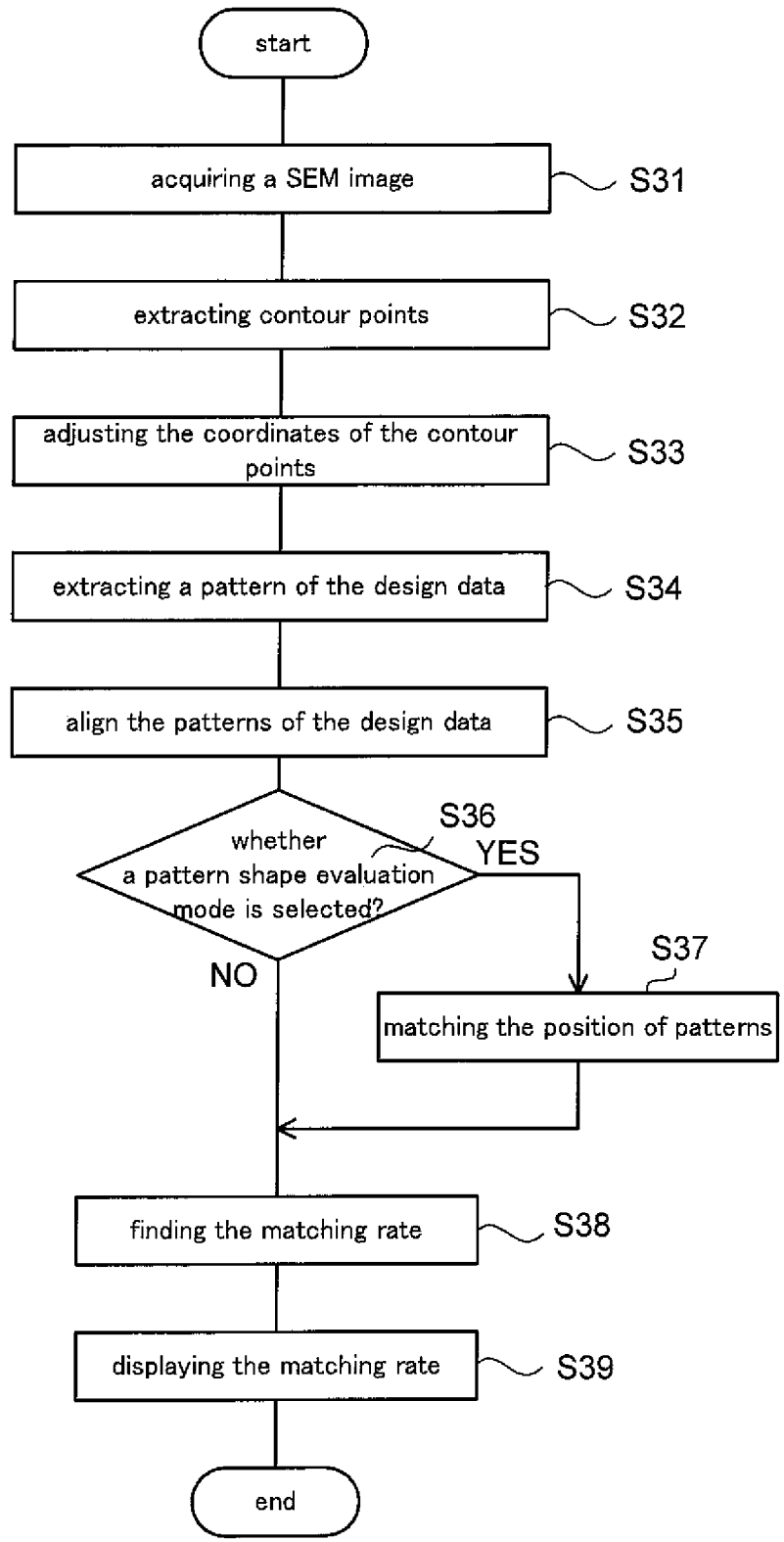
FIG. 13 is a flowchart showing a pattern inspection method according to the second embodiment.

Hereinbelow, a description is given of a pattern inspection method according to this embodiment. FIG. 13 is a flowchart showing the pattern inspection method according to this embodiment.

First, in Step S31 of FIG. 13, the pattern inspection apparatus 200 (see FIG. 12) acquires a SEM image of a sample 8 which is a measurement target while irradiating the sample with an electron beam 3a and scanning the sample.

The process next moves to Step S32, where the contour point extracting unit 73 of the SEM image processor 71 detects patterns contained in the SEM image acquired in Step S31 and extracts contour point sequences from edges of these patterns.

In this step, the contour point sequences are extracted in the following way. FIGS. 14A to 14D are views for describing a method of extracting a contour point sequence of one pattern of the SEM image.

Figure 14A:
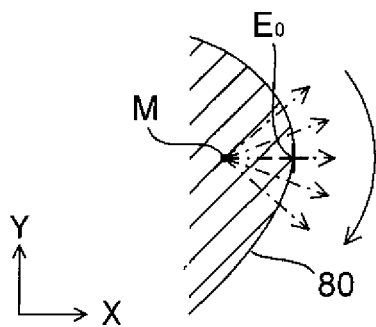
FIGS. 14A to 14E are views for describing a method of extracting a contour point sequence from a pattern of a SEM image with the pattern inspection method according to the second embodiment.

First, as shown in FIG. 14A, a point M contained inside a pattern 80 whose contour points are to be detected is searched in the SEM image. Subsequently, a plurality of lines starting from the point M are drawn with angles thereof changed as indicated by an arrow C. Then, line profiles along these lines are found respectively to search out edges of the pattern 80.

Here, an edge $E_0$ on a line profile drawn in the X direction is detected as a first contour point, for example.

Figure 14B:
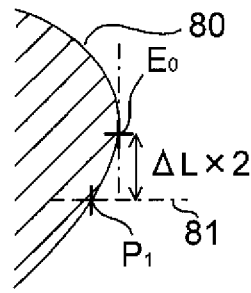

Next, as shown in FIG. 14B, a line 81 extending in the X direction is set at a position away from the edge $E_0$ in the Y direction by a distance twice as large as a designation step ΔL designating an extraction interval of contour points. Thereafter, a line profile along the line 81 is found, and a temporary detection edge $P_1$ is found by using the found line profile.

Figure 14C:
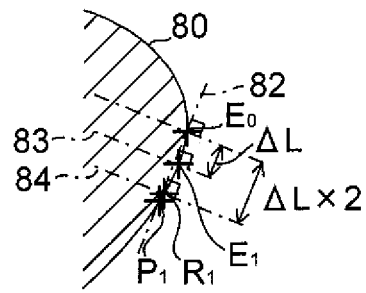

Then, as shown in FIG. 14C, a line 82 is set to pass through the edge $E_0$ and the temporary detection edge $P_1$. Subsequently, a line 83 orthogonal to the line 82 is set at a position away from the edge $E_0$ by the designation step ΔL along the line 82. Further, a line 84 orthogonal to the line 82 is set at a position away from the edge $E_0$ by a distance twice as large as the prescribed step ΔL along the line 82.

Thereafter, an edge $E_1$ is detected as a second contour point of the pattern 80 on the basis of a line profile along the line 83. Further, a re-detection edge $R_1$ is detected on the basis of a line profile along the line 84.

Figure 14D:
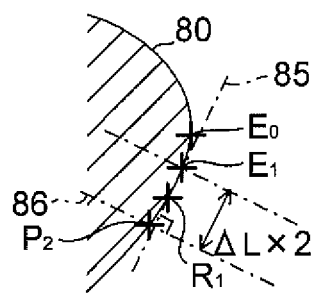

Next, as shown in FIG. 14D, a line 85 is set to pass through the edge $E_1$ and the re-detection edge $R_1$. Subsequently, a line 86 orthogonal to the line 85 is set at a position away from the edge $E_1$ by a distance twice as large as the designation step ΔL along the line 85. Then, a second temporary detection edge $P_2$ is detected by using a line profile along the line 86.

Figure 14E:
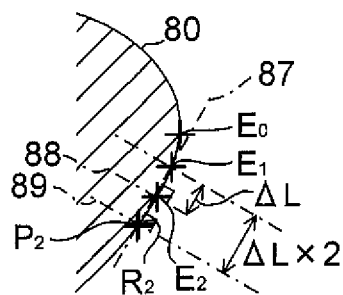

Next, as shown in FIG. 14E, a line 87 is set to pass through the edge $E_1$ and the temporary detection edge $P_2$. Subsequently, a line 88 orthogonal to the line 87 is set at a position away from the edge $E_1$ by the designation step $\Delta L$ along the line 87. Then, a third edge $E_2$ is detected on the basis of a line profile along the line 88.

Further, a line 89 orthogonal to the line 87 is set at a position away from the edge $E_1$ by a distance twice as large as the designation step $\Delta L$ along the line 87. Then, a second re-detection edge $R_2$ is detected on the basis of a line profile along the line 89.

After that, the processes described in FIGS. 14D and 14E are repeated to detect contour points on the entire periphery of the pattern 80. Lastly, an edge $E_n$ right above the edge $E_1$ is detected as a final edge, and the edge extraction of the pattern 80 is completed.

Further, the method described above is repeated for the other patterns of the SEM image to find contour points of all the patterns.

Next, in Step S33 of FIG. 13, the contour point coordinate correcting unit 74 of the SEM image processor 71 adjusts the positional coordinates of the contour points detected in Step S32.

Here, the contour point coordinate correcting unit 74 adjusts the positional coordinates of the contour points on the basis of the distortion amount data stored in the storage 20. Thereby, displacement of the positional coordinates caused by distortion of the SEM image in the scanning direction is corrected, and accurate contour shapes of patterns can be found.

This embodiment also enables rapid correction of positional displacement caused by distortion with a smaller amount of calculations because positional displacement correction is performed not on all the pixels of the SEM image but only on the extracted contour points.

The process next moves to Step S34, where the pattern extracting unit 75 of the design data processor 72 extracts patterns of the design data.

In the case of the design data 31 of FIG. 1A, for example, the pattern extracting unit 75 cuts out the patterns 31a, 31b, and 31c each containing the plurality of small regions. Subsequently, the small regions contained in the pattern 31a are coupled together to be formed into one polygon. Further, the small regions contained in each of the patterns 31b and 31c are also coupled together to be formed into one polygon.

With the above processes, the extraction of the patterns of the design data is completed.

The process next moves to Step S35, where the alignment unit 76 (see FIG. 12) aligns the patterns of the design data extracted in Step S34 with the patterns of the SEM image.

Here, the patterns of the design data are aligned with the patterns of the SEM image while a relative positional relation among the patterns of the design data is maintained, and in such a way that edges of, for example, three patterns representative of the design data match contour point sequences of the corresponding patterns of the SEM image.

In this alignment process, when the patterns are placed on the SEM image while maintaining a relative positional relation as the same as the patterns of the design data, a matching rate between the patterns of the SEM image and the patterns of the design data is high, i.e., a matching rate to be obtained in this alignment process reflects a result of whether the patterns are placed accurately.

The process next moves to Step S36, where the controller 70 judges whether a pattern shape evaluation mode is selected. If the controller 70 judges that the pattern shape evaluation mode is not selected (NO) in Step S36, the process moves to Step S38 to calculate the matching rate. In contrast, if the controller 70 judges that the pattern shape evaluation mode is selected (YES) in Step S36, the process moves to Step S37 to further align each of the patterns of the design data with the corresponding pattern of the SEM image.

The alignment process in Step S37 is performed without consideration of the relative positional relation among the patterns of the design data, and in such a way that edges of each pattern of the design data match contour points of the corresponding pattern of the SEM image as closely as possible.

In this alignment process, the closer the shape of each pattern of the design data is to the shape of the corresponding pattern of the SEM image, the higher the matching rate is therebetween. Thus, the matching rate obtained in this alignment process reflects the matching degree of the shape of each pattern of the SEM image with the shape of the corresponding pattern of the design data.

The process then moves to Step S38.

In the next Step S38, the comparison inspection unit 77 (see FIG. 12) finds the matching rate between each patterns of the design data and the corresponding patterns of the SEM image which are aligned with each other in the previous step.

In this process, a difference value $\Delta S$ is found which represents the area of a portion where the pattern of the design data does not overlap the pattern of the SEM image. Then, a matching rate H of the patterns is calculated on the basis of the found difference value $\Delta S$ and an area $S_{design}$ of the pattern of the design data by the following formula:

$$H=1-(\Delta S/S_{design}) \qquad (1)$$

The matching rate H found by the above formula (1) exhibits a maximum value 1 when the patterns of the design data and the SEM image match completely. In contrast, the matching rate exhibits 0 when the pattern of the SEM image is absent or when the pattern of the SEM image does not overlap the pattern of the design data at all.

It should be noted that the matching rate is regarded as 0 when calculation of the matching rate H by the formula (1) returns a negative value, e.g., when the pattern of the SEM image has an area twice or more as large as the pattern of the design data.

In this process, the difference value $\Delta S$ is found with any of the following calculation methods according to how the pattern of the design data overlaps the pattern of the SEM image.

Figure 15A:
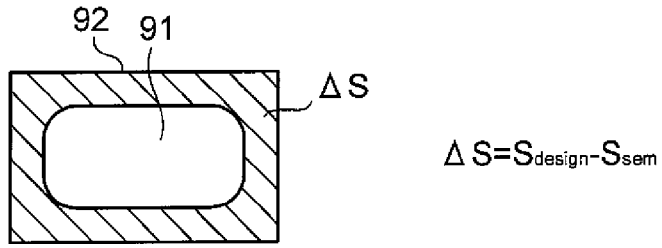
FIGS. 15A to 15C are views for describing how to find a difference value between a pattern of design data and the pattern of the SEM image in the pattern inspection method according to the second embodiment.
Figure 15B:
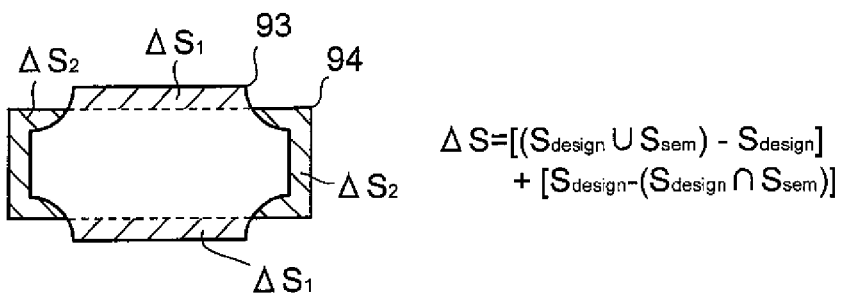
Figure 15C:
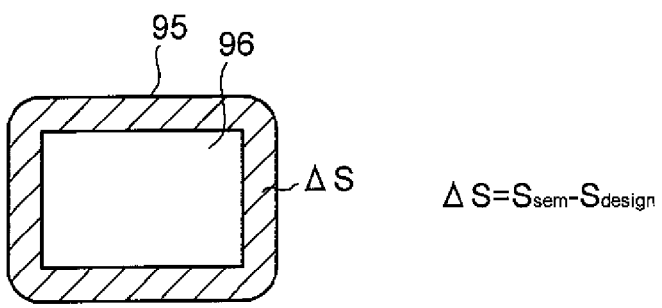

FIGS. 15A to 15C are views for describing how to find the difference value between the pattern of the design data and the pattern of the SEM image.

When a pattern 91 on the SEM image is contained inside a pattern 92 on the design data as shown in FIG. 15A, the difference value $\Delta S$ is found by subtracting an area $S_{SEM}$ of the pattern of the SEM image from an area $S_{design}$ of the pattern of the design data. A hatched portion in FIG. 15A corresponds to the difference value $\Delta S$.

On the other hand, when a pattern 93 on the SEM image partially overlaps a pattern 94 on the design data as shown in FIG. 15B, the difference value $\Delta S$ is found by adding an area $\Delta S_1$ of a portion where the pattern 93 does not overlap the pattern 94 to an area $\Delta S_2$ of a portion where the pattern 94 does not overlap the pattern 93.

On the other hand, when a pattern 95 on the SEM image is larger than a pattern 96 on the design data as shown in FIG. 15C, the difference value $\Delta S$ is found by subtracting an area $S_{design}$ of the pattern 96 from an area $S_{SEM}$ of the pattern 95.

The calculation of the matching rate between the patterns with the above methods is carried out on all the patterns within the field of view of the SEM image.

It should be noted here that, when each pattern of the design data is aligned with the corresponding pattern of the SEM image in Step S37, the matching rate found in this process reflects the shapes of the patterns.

In contrast, when the alignment in Step S37 is not performed, the matching rate found in this process reflects the placement positions of the patterns.

The process then moves to Step S39 of FIG. 13, where the controller 70 displays the calculation result of the pattern matching rates on a display 21, and the comparison inspection on the patterns is terminated.

As described above, this embodiment makes it possible to quantitatively evaluate the matching rate representing how much the shapes and placement positions of the patterns of the SEM image match those of the patterns of the design data.

The invention claimed is:

1. A pattern inspection apparatus comprising:
an electron scanning unit configured to scan a surface of a sample with an electron beam and to detect secondary electrons emitted from the surface of the sample;
a signal processor configured to create a SEM image of the sample on the basis of a relation between irradiation position with the amount of the secondary electrons;
a storage configured to store distortion amount data representing a magnitude of positional displacement in a scanning direction of the electron beam, the positional displacement being caused by distortion of the SEM image; and
a controller configured to match design data of the sample with the SEM image by adjusting at least one of the design data and the SEM image on the basis of the distortion amount data,
wherein the controller includes:
a measurement region setting unit configured to set a measurement region on a pattern of the design data for the sample with reference to the design data;
a measurement region adjusting unit configured to adjust positional coordinates of the measurement region on the design data on the basis of the distortion amount data and to place the adjusted measurement region on the SEM image; and
a measurement unit configured to measure dimensions of a pattern inside the measurement region on the SEM image.

2. The pattern inspection apparatus according to claim 1, wherein the measurement unit corrects positional coordinates of edges of the pattern on the basis of the distortion amount data, and then detects a distance between the edges of the pattern as a length of the pattern, the edges being detected on the SEM image.

3. The pattern inspection apparatus according to claim 1, wherein the controller includes an alignment unit configured to align the measurement region on the design data with the SEM image on the basis of contour points of the pattern of the SEM image and vertices of the pattern of the design data.

4. The pattern inspection apparatus according to claim 1, wherein the controller includes:
a contour point coordinate correcting unit configured to correct coordinates of contour points of a pattern of the SEM image on the basis of the distortion amount data;
an alignment unit configured to align a pattern of the design data with the pattern of the SEM image with reference to the design data for the sample and on the basis of the contour points of the pattern of the SEM image and vertices of the pattern of the design data; and
a comparison inspection unit configured to measure a matching rate between the pattern of the design data and the pattern of the SEM image.

5. The pattern inspection apparatus according to claim 1, wherein the electron scanning unit includes a magnetic deflector configured to move the electron beam for scanning.

6. A pattern inspection method comprising the steps of:
creating a SEM image of a sample by scanning a surface of the sample with an electron beam and detecting secondary electrons emitted from the surface of the sample; and
matching design data of the sample with the SEM image on the basis of distortion amount data representing a magnitude of positional displacement in a scanning direction of the electron beam, the positional displacement being caused by distortion of the SEM image;
setting a measurement region on a pattern of the design data for the sample with reference to the design data;
adjusting positional coordinates of the measurement region on the design data on the basis of the distortion amount data, and then placing the adjusted measurement region on the SEM image; and
measuring dimensions of a pattern inside the measurement region on the SEM image.

7. The pattern inspection method according to claim 6, further comprising the step of correcting positional coordinates of edges of the pattern on the basis of the distortion amount data, and then detecting a distance between the edges of the pattern as a length of the pattern, the edges being detected on the SEM image.

8. The pattern inspection method according to claim 6, further comprising the step of aligning the measurement regions on the design data and the SEM image with each other on the basis of vertices of the pattern of the design data and contour points of the pattern of the SEM image.

9. The pattern inspection method according to claim 6, further comprising the steps of:
detecting positions of edges of the pattern in the measurement region on the SEM image;
adjusting the edge positions on the basis of the distortion amount data, the edge positions being detected on the SEM image; and
measuring a distance between the edges on the basis of the adjusted edge positions.

10. The pattern inspection method according to claim 6, further comprising the steps of:
correcting coordinates of contour points of a pattern of the SEM image on the basis of the distortion amount data;
aligning a pattern of the design data with the pattern of the SEM image with reference to the design data for the sample and on the basis of the contour points of the pattern of the SEM image and vertices of the pattern of the design data; and
measuring a matching rate between the pattern of the design data and the pattern of the SEM image.

11. The pattern inspection method according to claim 6, further comprising the steps of:
acquiring a SEM image of a line space pattern made by placing line patterns and spaces alternately and respectively at regular intervals; and
finding distortion amount data on the basis of a relation between an edge position of the line space pattern detected in the SEM image and a real edge position of the line space pattern found from a width of each line pattern and a width of each space, the distortion amount data representing a magnitude of positional displacement caused by distortion of the SEM image.

* * * * *